United States Patent
Soo et al.

(10) Patent No.: US 8,847,144 B2
(45) Date of Patent: Sep. 30, 2014

(54) ENHANCED OPTICAL REFLECTIVE ENCODER

(75) Inventors: Yik-Foong Soo, Penang (MY); Weng Fei Wong, Penang (MY); Wee Jin Yeap, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 393 days.

(21) Appl. No.: 13/204,850

(22) Filed: Aug. 8, 2011

(65) Prior Publication Data

US 2013/0037705 A1    Feb. 14, 2013

(51) Int. Cl.
*G01D 5/347*    (2006.01)
*G01D 5/34*     (2006.01)

(52) U.S. Cl.
CPC ............ *G01D 5/34715* (2013.01); *G01D 5/347* (2013.01); *G01D 5/34* (2013.01)
USPC .................. 250/231.13; 250/231.14; 250/239; 356/617; 341/13; 33/1 L (58) Field of Classification Search
CPC ..... G01D 5/34; G01D 5/347; G01D 5/34707; G01D 5/34715; H01L 3/0203; H01L 31/167
USPC ............. 250/231.13, 231.14, 231.16–231.18, 250/239; 341/11, 13; 33/1 PT, 1 N, 1 L
See application file for complete search history.

(56) References Cited

U.S. PATENT DOCUMENTS

| | | | |
|---|---|---|---|
| 4,451,731 A | 5/1984 | Leonard | |
| 4,691,101 A | 9/1987 | Leonard | |
| 4,952,799 A * | 8/1990 | Loewen | 250/231.16 |
| 5,241,172 A | 8/1993 | Lugaresi | |
| 7,182,258 B2 | 2/2007 | Foo et al. | |
| 7,304,294 B2 | 12/2007 | Chin | |
| 7,309,855 B2 * | 12/2007 | Nagasaka et al. | 250/231.14 |
| 7,400,269 B2 | 7/2008 | Wong et al. | |
| 7,675,026 B2 * | 3/2010 | Lum et al. | 250/231.18 |
| 7,795,576 B2 | 9/2010 | Chin et al. | |
| 2010/0301195 A1 | 12/2010 | Thor et al. | |
| 2010/0327152 A1 | 12/2010 | Bahari et al. | |

* cited by examiner

*Primary Examiner* — Kevin Pyo (57) ABSTRACT

An optical encoder and optical encoding system are disclosed. Specifically, an encoder having a light detector elevated relative to a light source is described. The relative height difference between the light source and the light detector enables the optical encoder to minimize noise at the light detector without requiring a separate light baffle between the light source and light detector. Methods of manufacturing and operating such an encoder are also described.

20 Claims, 9 Drawing Sheets

ENHANCED OPTICAL REFLECTIVE ENCODER

FIELD OF THE DISCLOSURE

The present disclosure is generally directed toward encoders and more specifically toward optical encoders.

BACKGROUND

An encoder is a motion detector that provides closed-loop feedback to a motor control system. A typical optical encoder design includes an emitter/detector module, which can be designed in either a transmissive, reflective, or imaging configuration. When operated in conjunction with either a codewheel or codestrip, the encoder translates rotary motion or linear motion, as appropriate, into a two or three-channel digital output.

Figure 1A:
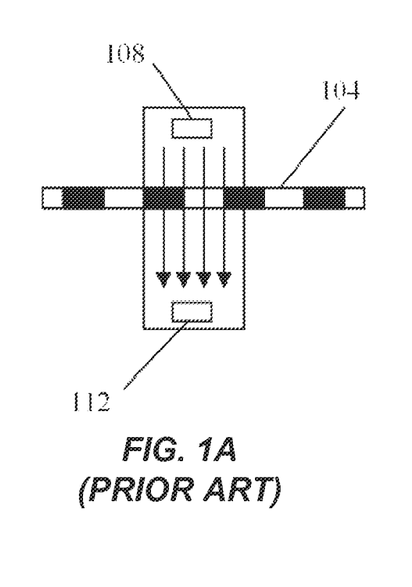
FIG. 1A depicts a transmissive encoder configuration according to the prior art.

FIG. 1A depicts a transmissive-type encoder. In this transmissive configuration, the encoder includes a light source 108 which transmits light through a codewheel or codestrip 104 and the light which passes through the codewheel or codestrip 104 is detected at a light detector 112.

Figure 1B:
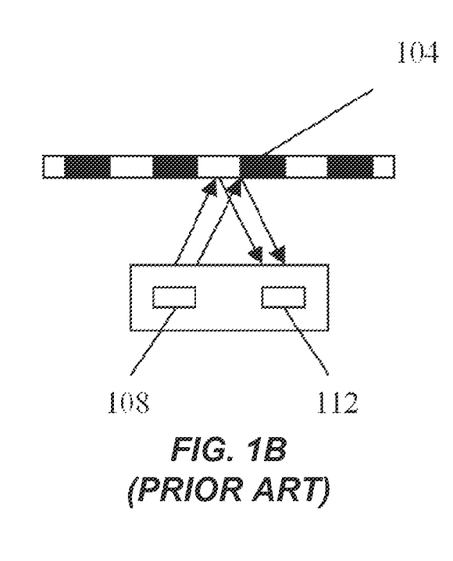
FIG. 1B depicts a reflective encoder configuration according to the prior art.

FIG. 1B depicts a reflective-type encoder. In this reflective configuration, the light source 108 transmits light toward a codewheel or codestrip 104 and the light which reflects off the codewheel or codestrip 104 is detected at the light detector 112.

Figure 1C:
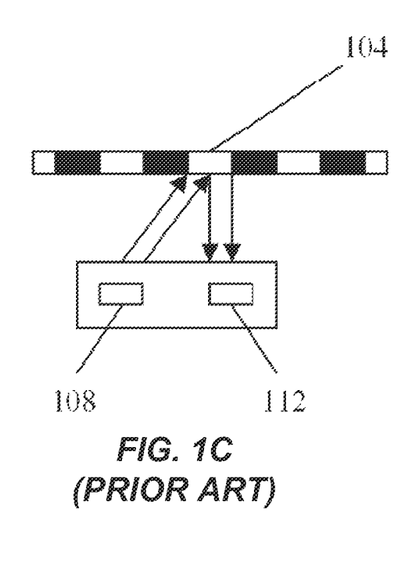
FIG. 1C depicts an imaging encoder configuration according to the prior art.

FIG. 1C depicts an imaging-type encoder. In this imaging configuration, the light source 108 illuminates a codewheel or codestrip 104 and the light detector 112 takes a series of images of the illuminated codewheel or codestrip 104 to detect motion of the codewheel or codestrip 104.

In reflective encoders, a lens may be provided over the light source 104 to focus the light onto the codewheel or codestrip 104. Light is either reflected or not reflected back to the lens over the light detector 112. As the codewheel or codestrip 104 moves, an alternating pattern of light and dark corresponding to the pattern of the bars and spaces falls upon the light detector 112. Often, the light detector 112 includes an array of photodiodes and these photodiodes detect these interruptions (light and dark) and the outputs of the photodiodes are processed by a signal processor of the encoder to produce digital waveforms. These encoder outputs can be used to provide information about position, velocity, and acceleration of the motor.

Reflective encoders provide advantages of compact size and easy assembly as compared to transmissive and imaging-type encoders. Particularly, the light source 108 and light detector 112 are provided on the same substrate, thereby allowing low product profile after assembly, fewer parts, and fewer assembly processes. However, reflective encoders suffer from its low image contrast that restricts the encoder from operating at high speed and resolution. Stray light reflected from the internal lens surfaces reach the photodetector arrays (PDAs), and this stray reflected light contributes to electrical noise in the reflective encoder.

Current solutions for dealing with this noise problem include incorporating a light baffle component in the encoder. Specifically, the light baffle is provided between the light source 108 and light detector 112 to block stray light from reaching the light detector 112. The light baffle helps to reduce the noise experienced by reflective encoders. Additional details of encoders which attempt to reduce the noise experienced at the light source 112 are described in one or more of U.S. Pat. Nos. 7,182,258; 7,304,294; and 7,795,576, each of which are hereby incorporated herein by reference in their entirety.

It would be desirable to provide an encoder, specifically a reflective encoder, that also addresses the stray light/noise issues of prior art reflective encoders without requiring the additional light baffle component. Specifically, incorporation of a light baffle component into the encoder requires special-purpose machinery, which is quite expensive, and adds additional steps to the manufacturing process, which adds time and expense to the manufacturing process.

BRIEF DESCRIPTION OF THE DRAWINGS

The present disclosure is described in conjunction with the appended figures.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Figure 2:
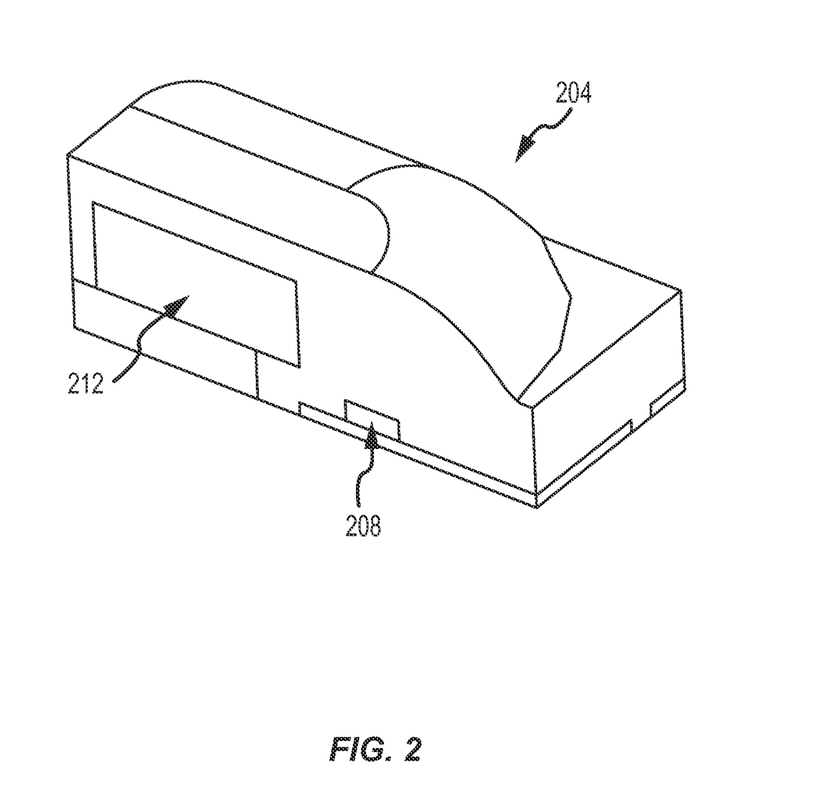
FIG. 2 is a perspective cross-sectional view of an encoder in accordance with embodiments of the present disclosure.
Figure 3:
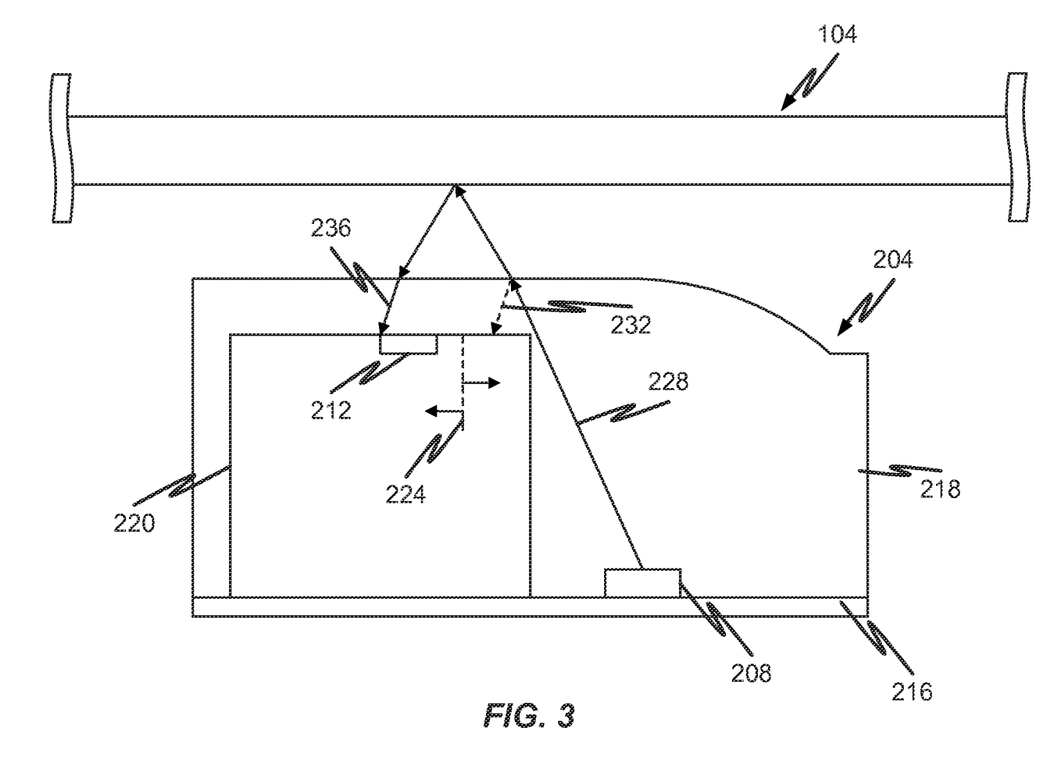
FIG. 3 is a block diagram depicting a first configuration of an encoder in accordance with embodiments of the present disclosure.

Referring now to FIGS. 2 and 3, components of an improved reflective optical encoding system will be described in accordance with embodiments of the present disclosure. The illustrated reflective optical encoding system includes an encoder 204 and a codewheel or codestrip 104. In some embodiments, the encoder 204 includes a light source 208 and a light detector 212, each of which are mounted to a common substrate 216 and encapsulated in a common encapsulant 218. In some embodiments, the encapsulant 218 protects the light source 208 and light detector 212 from environmental hazards (e.g., moisture, debris, direct physical impacts, etc.), but the encapsulant 218 also acts as a lens for directing light from the light source 208 to the light detector 212. Accordingly, the outer surface of the encapsulant 218 may have one or more curved features for shaping light as it travels from the light source 208 to the light detector 212.

In some embodiments, the encapsulant 218 may comprise a plastic housing or molding which is molded around the light source 208 and light detector 212. As some non-limiting examples, the encapsulant 218 may comprise epoxy, silicone, a hybrid of silicone and epoxy, phosphor, a hybrid of phosphor and silicone, an amorphous polyamide resin or fluorocarbon, glass, plastic, or combinations thereof.

In the depicted embodiment, the profile of the top surface of the encapsulant 218 (e.g., the surface between the light source 208 and codewheel or codestrip 104) is substantially flat between an area above the light source 208 and an area above the light detector 212. This is somewhat different from traditional reflective encoders, which traditionally provide a curved top surface of the encapsulant 218. It should be appreciated, however, that the top surface of the encapsulant 218 may be curved along one or more portions between the light source 208 and light detector 212.

The substrate 216, in one example, may correspond to a printed circuit board (PCB) layer that is constructed of plastic (e.g., PET, PTFE, PVC, etc.), ceramic, glass, metal, alloys, or combinations thereof. As some other examples, the substrate 216 may comprise a leadframe, an insert-molded leadframe, a flexible printed circuit, a ceramics substrate, and/or a micro-interconnecting device (MID). Any suitable material known for constructing such a PCB, leadframe, flexible printed circuit, or MID may be used for the substrate 216. In some embodiments, the substrate 216 may also be primarily manufactured of a composite that conforms with the FR-4 and/or G-10 manufacturing specifications. It should be appreciated that the substrate 216 may be flexibly, rigid, semi-flexible, or semi-rigid. The construction of the substrate 216 may depend upon the intended application for the encoder 204.

In some embodiments, and as can be seen in the example depicted in FIG. 3, the light source 208 and light detector 212 may be mounted on a common surface (e.g., the top surface) of the common substrate 216. In some embodiments, the light detector 212 is mounted to the common substrate 216 via a detector integrated circuit (IC) 220. The detector IC 220 may be provided to receive electrical signals from the light detector 212, process electrical signals received from the light detector 212, as well as help minimize the amount of stray light that is detected at the light detector 212. More specifically, the light-detecting surface (e.g., the top surface) of the light detector 212 may be elevated relative to the light-emitting surface (e.g., the top surface) of the light source 208. Even more specifically, the light-detecting surface of the light detector 212 may be closer to the codewheel or codestrip 104 than the light-emitting surface of the light source 208. Said another way, the light-detecting surface of the light detector 212 may be further away from the top surface of the common substrate 216 than the light-emitting surface of the light source 208.

By altering the relative heights of the light detector 212 and light source 208 and specifically by elevating the light detector 212 relative to the light source 208, embodiments of the present disclosure enable the creation of an encoder 204 that has the advantages of compactness as well as enhanced noise reduction without requiring a separate light baffle component between the light source 208 and light detector 212. It is somewhat counterintuitive to suggest raising the profile of the encoder 204 by establishing different heights for the light source 208 and light detector 212. However, this slightly increased profile of the encoder 204 enables a significant size reduction in the other two dimensions (e.g., x and y dimensions, length and width dimensions, etc.) of the encoder 204, not to mention the need for a separate light baffle component is no longer present. Accordingly, significant gains are realized for the encoder 204 by sacrificing less than a fraction of a millimeter in encoder height. It may also be possible to realize a low-profile encoder 204 by intelligently selecting the relative dimensions of the encoder 204 components and barely In some embodiments, the light source 208 includes a single light source such as a light-emitting diode (LED). For convenience, the light source 208 is described herein as an LED, although other light sources (e.g., lasers, laser diodes, etc.), or multiple light sources (e.g., an array of LEDs), may be implemented. In one embodiment, the light source 208 is driven by a driver signal through a current-limiting resistor. The details of such driver circuits are well-known. Embodiments of the light source 208 also may include a lens aligned with the light source 208 to direct the projected light in a particular path or pattern. For example, the lens, which may be separate and distinct from the encapsulant 218, may focus the light onto the codewheel or codestrip 104.

In some embodiments, the light detector 212 includes one or more photodetectors such as photodiodes and the photodetectors may be configured in an array (e.g., a PDA). The photodetectors may be integrated, for example, into the detector IC 220. For convenience, the light detector 212 is described herein as a PDA, although other types of light detectors may be implemented. In one embodiment, the photodiodes of the light detector 212 are uniquely configured to detect a specific pattern or wavelength of reflected light. Also, the photodiodes may be arranged in a pattern that corresponds to the radius and design of the codewheel or codestrip 104.

The signals produced by the light detector 212 are processed by signal processing circuitry within the detector IC 220 which generates the channel signals, $CH_A$, $CH_B$, and/or $CH_I$. In one embodiment, the detector IC 220 also includes one or more comparators (not shown) to generate the channel signals and index signal. For example, analog signals from the light detector 212 may be converted by the comparators to transistor-transistor logic (TTL) compatible, digital output signals. In one embodiment, these output channel signals may indicate count and direction information for the modulated, reflected light signal.

Additional details of emitters, detectors, and optical encoders, generally, may be referenced in U.S. Pat. Nos. 4,451,731, 4,691,101, 5,241,172, and 7,400,269, each of which are hereby incorporated herein by reference in their entirety.

Furthermore, although embodiments of the present disclosure are particularly directed toward a reflective optical encoder, it should be appreciated that similar photodiode array and/or encoder 204 configurations can be utilized in an imaging optical encoding system without departing from the scope of the present disclosure.

Referring still to FIG. 3, the encapsulant 218 of the encoder 204 may be configured to direct light emitted by the light source 228 toward the codewheel or codestrip 104. Upon reaching the upper boundary of the encapsulant 218, the light emitted by the light source 228 may be separated into light that impacts the codewheel or codestrip 236 (e.g., light which is transmitted out of the encapsulant 218 toward the codewheel or codestrip 104) and reflected stray light 232 (e.g., light which reflects off the internal face of the encapsulant 218).

In some embodiments, the light detector 212 may be positioned on the top surface of the detector IC 220 such that it is substantially shielded from receiving the reflected stray light 232. More specifically, there may be a boundary line 224 on the detector IC 220 that represents the location beyond which the reflected stray light 232 is substantially unable to directly contact the top surface of the detector IC 220. This boundary line 224 may simply be an imaginary line on the detector IC 220 or it may be actually indicated on the detector IC 220 with any type of visible mark or collection of marks.

In some embodiments, the top surface of the detector IC 220 may be separated into two different areas. The first area may correspond to an area where the reflected stray light 232 is received (or conversely the area where the light that impacts the codewheel or codestrip 236 is not received) and the second area may correspond to an area where the reflected stray light 232 is not received (or conversely the area where the light that impacts the codewheel or codestrip 236 is received). The boundary line 224 may comprise a continuous and not necessarily linear division between the first area and the second area of the detector IC 220. In some embodiments it is desirable to position the light detector 212 in the second area without positioning the light detector 212 in the first area.

While some reflected stray light 232 may reflect off the top surface of the detector IC 220 and then reflect again off the top surface of the encapsulant 218 back toward the light detector 212, this triple-reflected stray light will only cause a minimal amount of noise at the light detector 212 as compared to the light that impacts the codewheel or codestrip 236.

In some embodiments, the difference in height between the light source 208 and the light detector 212 enables the detector IC 220 to block most of the reflected stray light 232 from reaching the light detector 212. With a properly configured detector IC 220 and light detector 212, the reflected stray light 232 only reaches a relatively small area of the detector IC 220. Thus, the light detector 212 can be designed onto the top area of the detector IC 220 to primarily receive the light that impacts the codewheel or codestrip 236. In some embodiments, the light detector 212 may be positioned on the detector IC 220 such that the light contrast realized at the detector is approximately 93%. This contrast realization is substantially similar to the contrast realized by encoders that employ a separate light baffle component to separate the light source from the light detector. Encoders incorporating such a light baffle have been shown to realize a contrast at the light detector of approximately 94%.

Figure 4:
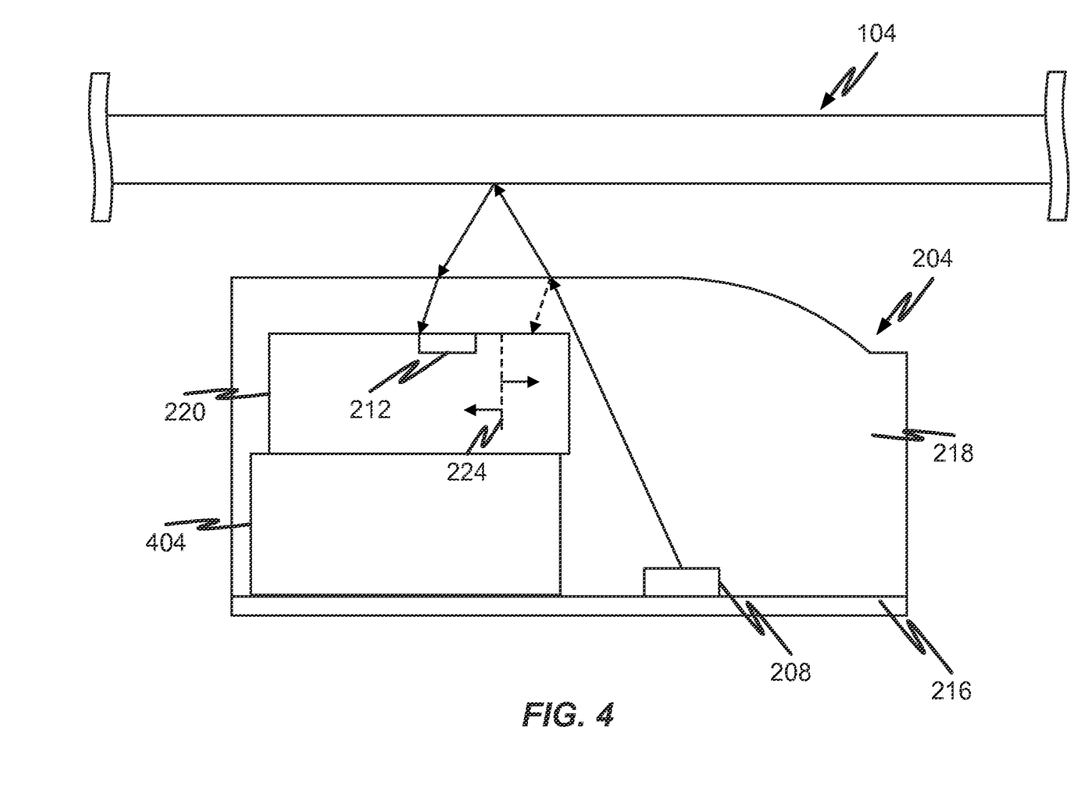
FIG. 4 is a block diagram depicting a second configuration of an encoder in accordance with embodiments of the present disclosure.

FIG. 4 depicts a second possible configuration of an encoder 204 in accordance with embodiments of the present disclosure. This particular configuration comprises a spacer 404 that is mounted between the detector IC 220 and the substrate 216. Specifically, a bottom surface of the spacer 404 may be mounted to the substrate 216 and the detector IC 220 may be mounted to the top surface of the spacer 404. In some embodiments, the spacer 404 may be formed out of a material similar or identical to the encapsulant 218. In some embodiments, the spacer 404 comprises a simple piece of material that is electrically neutral, but is capable of elevating the detector IC 220 relative to the light source 208.

As can be appreciated, the dimensions of the spacer 404 may be altered to move the location of the boundary line 224 on top of the detector IC 220. It should also be appreciated that the spacer 404 may, but does not necessarily have to, comprise a top surface area that is equal in size to the bottom surface area of the detector IC 220. It may also be possible to provide a spacer that comprises either a larger or smaller surface area on its top surface as compared to the surface area of the detector IC's 220 bottom surface.

Figure 5:
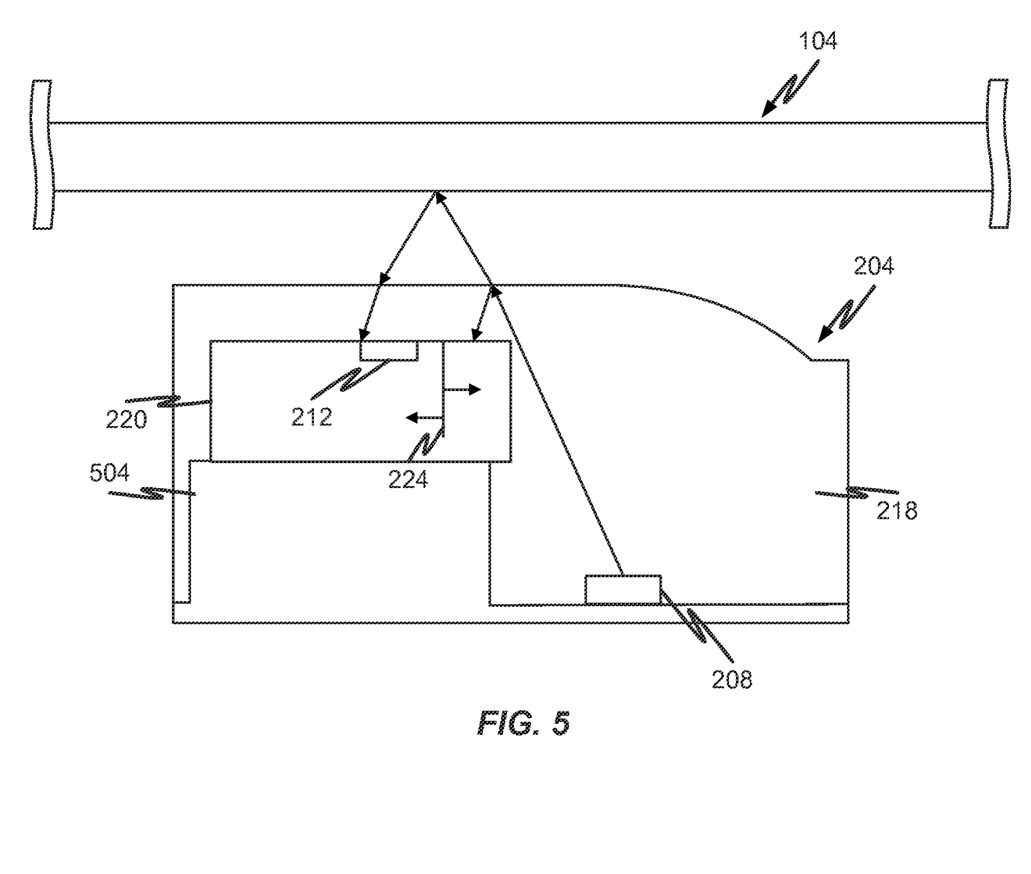
FIG. 5 is a block diagram depicting a third configuration of an encoder in accordance with embodiments of the present disclosure.

FIG. 5 depicts another configuration of the encoder 204 in accordance with embodiments of the present disclosure. This particular configuration comprises a custom-designed substrate structure 504 that has an elevated portion onto which the detector IC 220 is mounted. The portion of the substrate structure 504 underneath the detector IC 220 may comprise the necessary thickness to elevate the detector IC 220 and light detector 212 relative to the light source 208 as desired.

Figure 6:
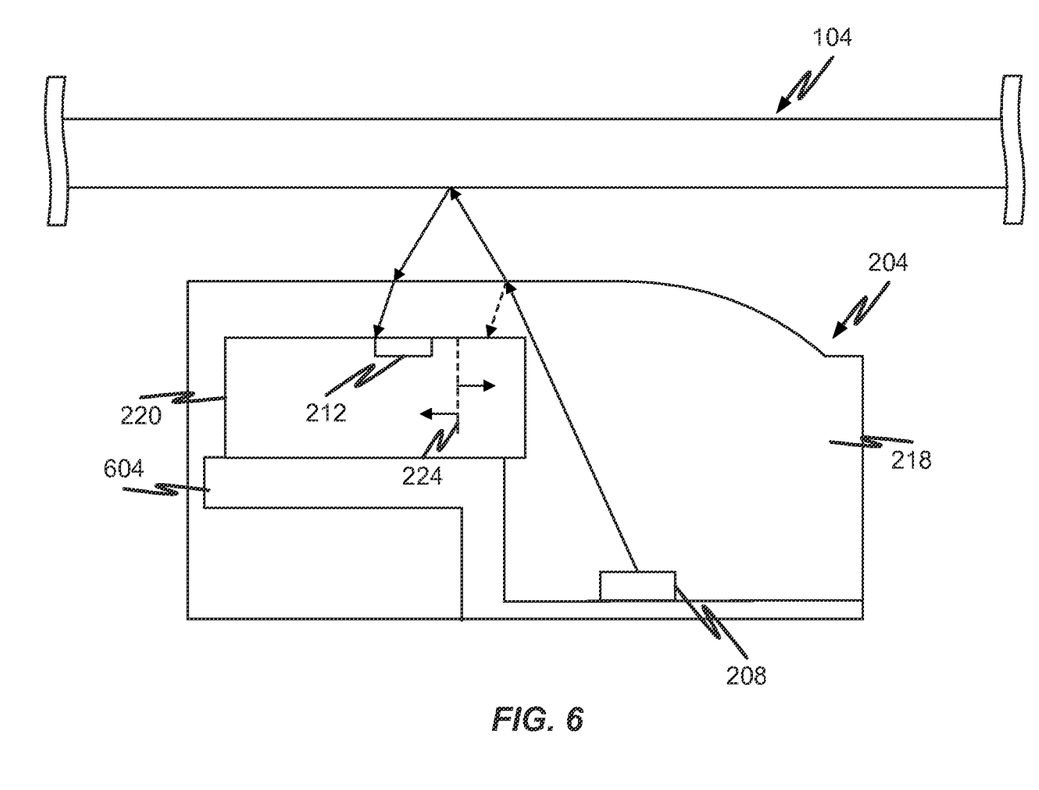
FIG. 6 is a block diagram depicting a fourth configuration of an encoder in accordance with embodiments of the present disclosure.

FIG. 6 depicts another configuration of the encoder 204 in accordance with embodiments of the present disclosure. This particular configuration comprises a different custom-designed substrate structure 604. This substrate structure 604 may differ from substrate structure 504 in that the thickness of the substrate structure 604 is relatively uniform but a portion of the uniform thickness substrate structure 604 is elevated relative to another portion of the substrate structure 604. In some embodiments, the detector IC 220 may be mounted directly to the elevated portion of the substrate structure 604.

Figure 7:
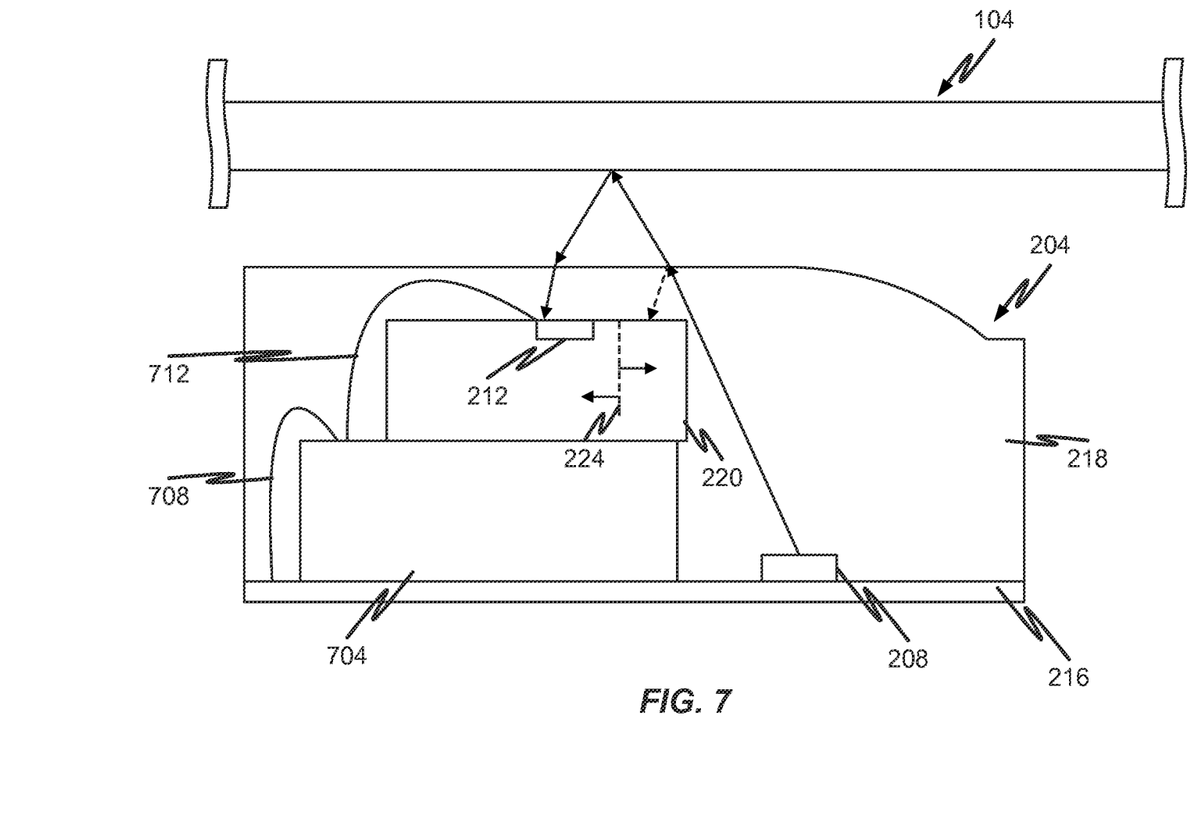
FIG. 7 is a block diagram depicting a fifth configuration of an encoder in accordance with embodiments of the present disclosure.

FIG. 7 depicts another configuration of the encoder 204 in accordance with embodiments of the present disclosure. This particular configuration comprises a stacked die configuration where the detector IC 220 is stacked on top of a second IC chip 704. In some embodiments, the second IC chip 704 may be provided to (i) perform different processing routines than the processing routines performed by the detector IC 220 and/or (ii) further elevate the detector IC 220 and light detector 212 relative to the light source 208. As a non-limiting example, the second IC chip 704 may correspond to an interpolation IC chip that is responsible for performing interpolation calculations for the encoder 204 whereas the detector IC 220 is responsible for converting the electrical signals received from the light detectors 212 into digital output signals.

In some embodiments, the second IC chip 704 may be directly electrically connected to an electrical trace, bonding pad, solder bump, input pin, etc. on the top surface of the substrate 216 via a first lead 708. The detector IC chip 220 may be directly electrically connected to an electrical trace, bonding pad, solder bump, input pin, through silicon via (TSV), etc. on the top surface of the second IC chip 704 via a second lead 712. The first and/or second leads may correspond to bonding wires, loops of electrically-conductive material, electrical traces, or the like.

Figure 8:
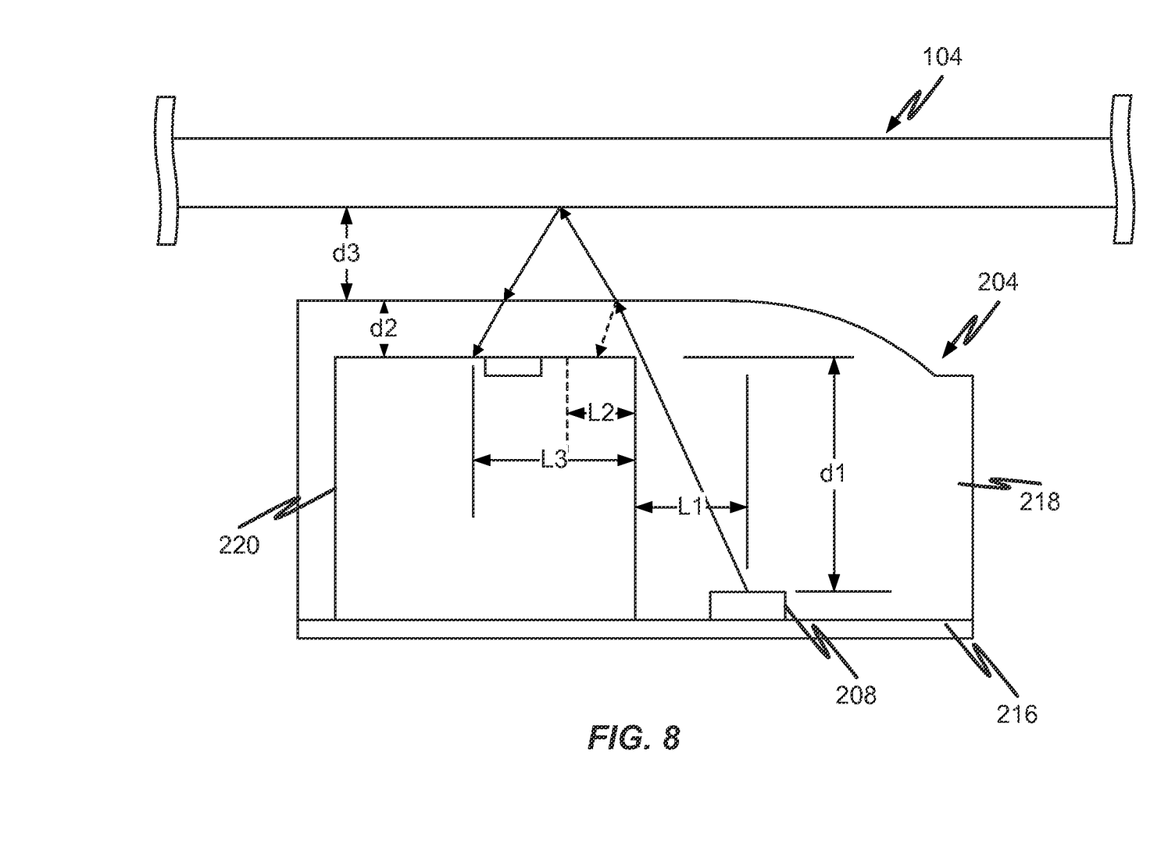
FIG. 8 is a block diagram depicting dimensions of an encoder in accordance with embodiments of the present disclosure.

FIG. 8 depicts a non-limiting example of the relative dimensions of the encoder 204 as well as dimensions of the optical encoding system incorporating the encoder 204 in accordance with embodiments of the present disclosure. The dimensions depicted in FIG. 8 represent the following:

d1=height difference between the light-emitting surface of the light source 208 and the light-detecting surface of the light detector 212.

d2=encapsulant 218 thickness from top surface of detector IC chip 220 (also corresponding to top surface of light detector 212) to top surface of encapsulant 218.

d3=gap between codewheel or codestrip 104 and top surface of encapsulant 218. This gap may be filled with liquid, gas, or any combination of gases (e.g., air).

L1=distance from center of light-emitting area of light source 208 to near edge of detector IC chip 220.

L2=detector IC chip 220 length with coverage of reflected stray light 232 (e.g., distance from near edge of detector IC chip 220 to boundary line 224).

L3=detector IC chip 220 length with optical signal coverage.

n1=refractive index of encapsulant 218.

n2=refractive index of material in gap between encoder 204 and codewheel or codestrip 104 (e.g., refractive index of air).

In particular, Equation 1 represents the dimensions of L1, L2, d1, and d2 if the detectors 212 were positioned on the detector IC chip 220 to capture the reflected stray light 232.

$$L_2 = 2 * L_1 * \left(\frac{d_2}{d_1}\right) \quad \text{Equation 1}$$
detector positioning to capture reflected stay light Equation 2, on the other hand, represents the dimensions of the encoder 204 components required to capture the optical signal (e.g., the light that impacts the codewheel or codestrip 236).

$$L_3 = 2 * L_1 * \left(\frac{d_2}{d_1}\right) + 2 * d_3 * \tan\left(\text{Sin}^{-1}\left(\frac{n_2 * L_2}{n_1 * L_1 * \sqrt{\frac{L_2^2}{4} + d_2^2}}\right)\right) \quad \text{Equation 2}$$
detector positioning to capture optical signal from light emitter L2 according to Equation 1 can be subtracted from L3 according to Equation 2 to determine the appropriate position of the light detectors 212 on top of the detector IC chip 220 to maximize detection of the optimal signal while minimizing detection of the reflected stray light 232. The result of subtracting Equation 1 from Equation 2 is represented in Equation 3 below.

$$L_3 - L_2 = 2 * d_3 * \tan\left(\text{Sin}^{-1}\left(\frac{n_2 * L_2}{n_1 * L_1 * \sqrt{\frac{L_2^2}{4} + d_2^2}}\right)\right) \quad \text{Equation 3}$$
optimal detector positioning to capture optical signal with minimum noise In some embodiments, the dimensions of d1 can be anywhere between approximately 0.1 mm and approximately 0.5 mm. The dimensions of d1 can be anywhere between approximately 0.02 mm and approximately 0.2 mm. The dimensions of d3 can be anywhere between approximately 0.05 mm and approximately 0.3 mm. The dimensions of L1 can be anywhere between approximately 0.1 mm and approximately 0.3 mm. The dimensions of L2 can be anywhere between approximately 0.05 mm and approximately 0.2 mm. The dimensions of L3 can be anywhere between 0.1 mm and approximately 0.5 mm. It should be appreciated, however, that the relative dimensions of the above-described components can be altered to maximize optical signal detection and/or minimize reflected stray light detection.

In some embodiments, a distance from the light-detecting surface to the top surface of the encapsulant 218 (i.e., d2) is at least half as small as a distance from the light-emitting surface to the top surface of the encapsulant (i.e., d1+d2). In some embodiments, d1 may be less than one third the sum of d1 and d2. In some embodiments, d1 may be less than one fourth the sum of d1 and d2. In some embodiments, d1 may be less than one tenth the sum of d1 and d2.

It should be appreciated that dimensions obtained from the Equations 1, 2 & 3 are derived from a non-limiting encoder 204 design which includes flat molded surfaces. Other encoders incorporating the embodiments described herein may be utilized. For example, embodiments of the present disclosure may also be implemented in encoders having a molded surface with one or more curvatures. In such an example, the relative dimensions of the components of the encoder may vary from the dimensions described above, but such variations are considered to be within the scope of the present disclosure.

Figure 9:
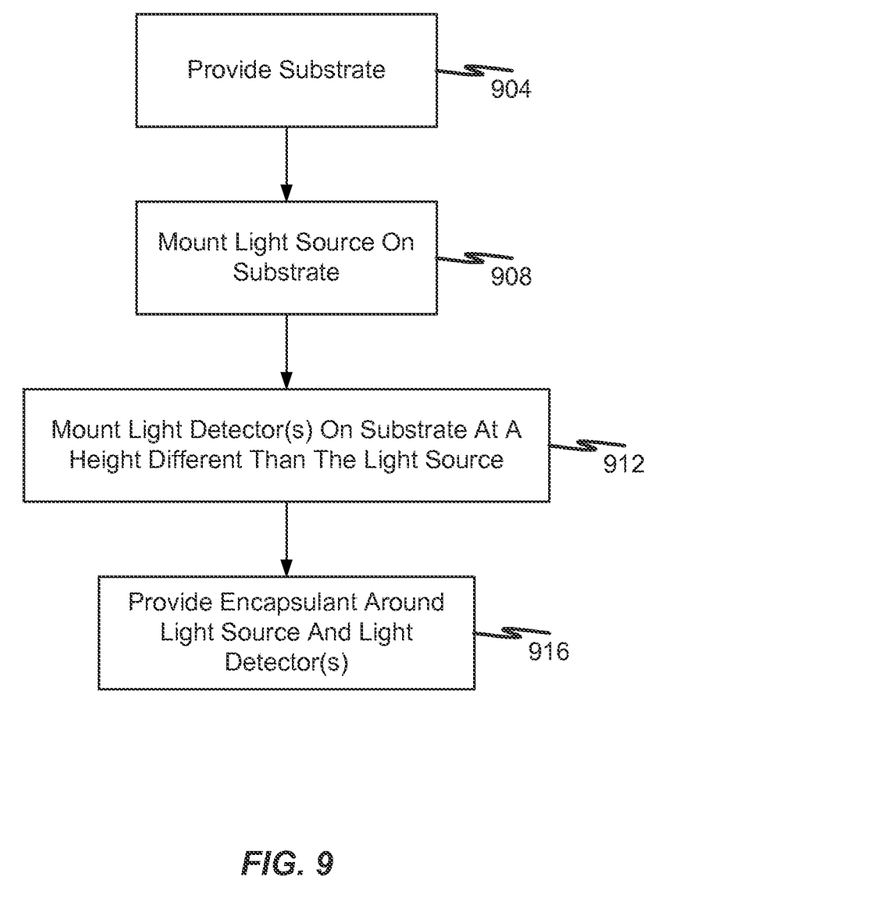
FIG. 9 is a flow diagram depicting an encoder-manufacturing method in accordance with embodiments of the present disclosure.

Referring now to FIG. 9, a method of manufacturing an encoder 204 will be described in accordance with embodiments of the present disclosure. The method begins when a substrate 216 is provided (step 904). Thereafter, one or more light sources 208 are mounted on the top surface of the substrate 216 (step 908). The light detector(s) 212 may also be mounted on the top surface of the substrate 216 (step 912). As can be appreciated, step 912 can be performed before or simultaneous with step 908. Moreover, the manner in which the light detector 212 is mounted to the substrate 216 may depend upon the configuration of the encoder 204. More specifically, the light detector 212 may be mounted to the substrate 216 directly via the detector IC chip 220 or additional dies may be mounted between the detector IC chip 220 and the substrate 216.

After the light source 208 and light detector 212 have been mounted to the substrate 216, the encapsulant 218 is provided around the light source 208 and light detectors 212 to achieve the final encoder 204 package (step 916). This finalized encoder 204 package may then be positioned relative to a codewheel or codestrip 104 and electrical leads may be connected to the encoder 204.

It should be appreciated that embodiments of the present disclosure may be applied to any type of encoder configuration. As some examples, the concepts described herein can be applied to: (a) incremental encoders with 2 and/or 3 channels; (b) commutation encoders which have 6 channels; (c) pseudo absolute encoders; (d) absolute encoders; and (e) combinations thereof.

There are many advantages to utilizing the encoder designs described herein. As one example, high performance encoders 204 can be realized as the noise level of the encoder caused by the stray reflected light 232 to the detector has been minimized or eliminated. Hence, the encoder 204 is useable in high speed rotary or linear systems. As another example, the light source 208 and the light detector 212 can be placed in very close proximity (as there is no physical barrier between them). This design enables extremely small packages for extremely small form factors. As another example, since the encoder 204 does not require an additional light barrier to block the stray reflected light 232, there is no introduction of additional fabrication/assembly processes other than the typical semiconductor assembly processes. It also becomes possible to integrate other functions into the encoder 204 with the stacked die configuration. As still another example, low encoder costs can be realized with small package size and without introducing additional material or assembly processes.

Specific details were given in the description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An encoder for use in an optical encoding system, comprising:
a light source configured to emit light from a light-emitting surface;
a light detector configured to receive, at a light-detecting surface, at least a portion of the light emitted by the light source and reflected off an object, wherein the light-detecting surface is positioned at a different height relative to the light-emitting surface such that reflected stray light that has once reflected off a surface of an encapsulant of the encoder that at least encapsulates the light source and has not reflected off the object is substantially unable to directly impact the light detector and such that only reflected stray light that has twice or more reflected off the surface of the encapsulant is able to impact the light detector.

2. The encoder of claim 1, further comprising a substrate onto which both the light source and light detector are mounted, wherein a first distance between a top surface of the substrate and the light-detecting surface is greater than a second distance between the top surface of the substrate and the light-emitting surface.

3. The encoder of claim 2, wherein the light detector is mounted to the substrate via a detector integrated circuit.

4. The encoder of claim 3, wherein the encapsulant encapsulates both the light source and light detector, wherein the encapsulant comprises a top surface that is configured to separate the light emitted by the light source into transmitted light and the reflected stray light.

5. The encoder of claim 3, further comprising a second integrated circuit mounted between the detector integrated circuit and the substrate, wherein the detector integrated circuit is configured to perform a first processing operation on signals received from the light detector and provide a first output to the second integrated circuit, and wherein the second integrated circuit is configured to perform a second processing operation on the first output received from the detector integrated circuit.

6. The encoder of claim 2, wherein the substrate comprises an elevated portion onto which the light detector is mounted and wherein the light source is not mounted on the elevated portion.

7. The encoder of claim 2, further comprising a spacer mounted between the detector integrated circuit and the substrate.

8. The encoder of claim 1, wherein the light detector comprises an array of photodetectors.

9. The encoder of claim 1, wherein light source comprises an LED.

10. The encoder of claim 1, wherein the object comprises at least one of a codewheel and codestrip.

11. A reflective optical encoding system, comprising:
an encoder including a light source encapsulated by an encapsulant and a light detector, the light source and light detector being positioned within the encoder such that a light-detecting surface of the light detector is at a different height than a light-emitting surface of the light source such that reflected stray light that has once reflected off a surface of the encapsulant of the encoder and has not reflected off an illuminated object is substantially unable to directly impact the light detector and such that only reflected stray light that has twice or more reflected off the surface of the encapsulant is able to impact the light detector.

12. The system of claim 11, wherein the encapsulant encapsulates both the light source and light detector.

13. The system of claim 12, wherein the light-detecting surface of the light detector is closer to a top surface of the encapsulant than the light-emitting surface of the light source.

14. The system of claim 12, wherein the top surface of the encapsulant is configured to separate light emitted by the light source into the reflected stray light and transmitted light, the transmitted light corresponding to light that illuminates the object.

15. The system of claim 14, further comprising a detector integrated circuit, wherein the light detector is mounted on a top surface of the detector integrated circuit.

16. The system of claim 15, wherein the top surface of the detector integrated circuit is separated into a first area where the reflected stray light is received and a second area where the reflected stray light is not received, and wherein the light detector is positioned in the second area and not the first area.

17. The system of claim 15, wherein the light-emitting surface of the light source is positioned below the top surface of the detector integrated circuit.

18. A method, comprising:
causing light to be emitted at a light-emitting surface of a light source;
separating the light emitted by the light source into reflected stray light and transmitted light, wherein the light emitted by the light source is separated with an encapsulant that encapsulates at least the light source; and
detecting, at a light-detecting surface of a light detector, the transmitted light after the transmitted light has reflected off an object, wherein the light-detecting surface is positioned at a different height relative to the light-emitting surface such that the reflected stray light created by the encapsulant that has not reflected off the object does not impact the light-detecting surface except for reflected stray light that twice or more reflects off a surface of the encapsulant.

19. The method of claim 18, wherein the light emitted by the light source is separated at a top surface of the encapsulant, wherein the encapsulant encapsulates both the light source and light detector.

20. The method of claim 19, wherein a distance from the light-detecting surface to the top surface of the encapsulant is at least half as small as a distance from the light-emitting surface to the top surface of the encapsulant.

* * * * *